(12) United States Patent
Kaneko et al.

(10) Patent No.: US 11,817,334 B2
(45) Date of Patent: Nov. 14, 2023

(54) SUBSTRATE PROCESSING APPARATUS AND SUBSTRATE PROCESSING METHOD

(71) Applicant: Tokyo Electron Limited, Tokyo (JP)

(72) Inventors: Haruka Kaneko, Miyagi (JP); Takehiko Arita, Miyagi (JP); Hayato Sakai, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 236 days.

(21) Appl. No.: 17/173,566

(22) Filed: Feb. 11, 2021

(65) Prior Publication Data
US 2021/0257235 A1 Aug. 19, 2021

(30) Foreign Application Priority Data
Feb. 19, 2020 (JP) ................................. 2020-026260

(51) Int. Cl.
*H01L 21/67* (2006.01)
*H05B 3/00* (2006.01)

(52) U.S. Cl.
CPC .. *H01L 21/67248* (2013.01); *H01L 21/67109* (2013.01); *H01L 21/67253* (2013.01); *H05B 3/0014* (2013.01)

(58) Field of Classification Search
CPC ......... H01L 21/67109; H01L 21/67248; H01L 21/67253; H05B 1/0233; H05B 3/0014
USPC ....................................................... 219/444.1
See application file for complete search history.

(56) References Cited

U.S. PATENT DOCUMENTS

| 2006/0201172 A1* | 9/2006 | Kaneko | ................... F25D 17/02 62/185 |
| 2008/0271471 A1* | 11/2008 | Nozawa | ................... F25D 17/02 118/724 |
| 2014/0311728 A1* | 10/2014 | Nonaka | ............. H01L 21/67103 165/104.31 |

FOREIGN PATENT DOCUMENTS

| JP | 2005-210080 A | 8/2005 |
| JP | 2016-162794 A | 9/2016 |
| JP | 2019-024055 A | 2/2019 |

* cited by examiner

*Primary Examiner* — Sang Y Paik
(74) *Attorney, Agent, or Firm* — Pearne & Gordon LLP

(57) ABSTRACT

A system of processing a substrate includes substrate-processing chambers; target components of temperature control disposed in the respective substrate-processing chambers; a chiller to supply a first temperature-controlling medium with a first flow rate and a second temperature-controlling medium with a second flow rate into the target components; flow controllers connected to the respective target components, each flow controller being configured to independently control a ratio of the first flow rate to the second flow rate to be fed into the corresponding target component from the chiller.

11 Claims, 5 Drawing Sheets

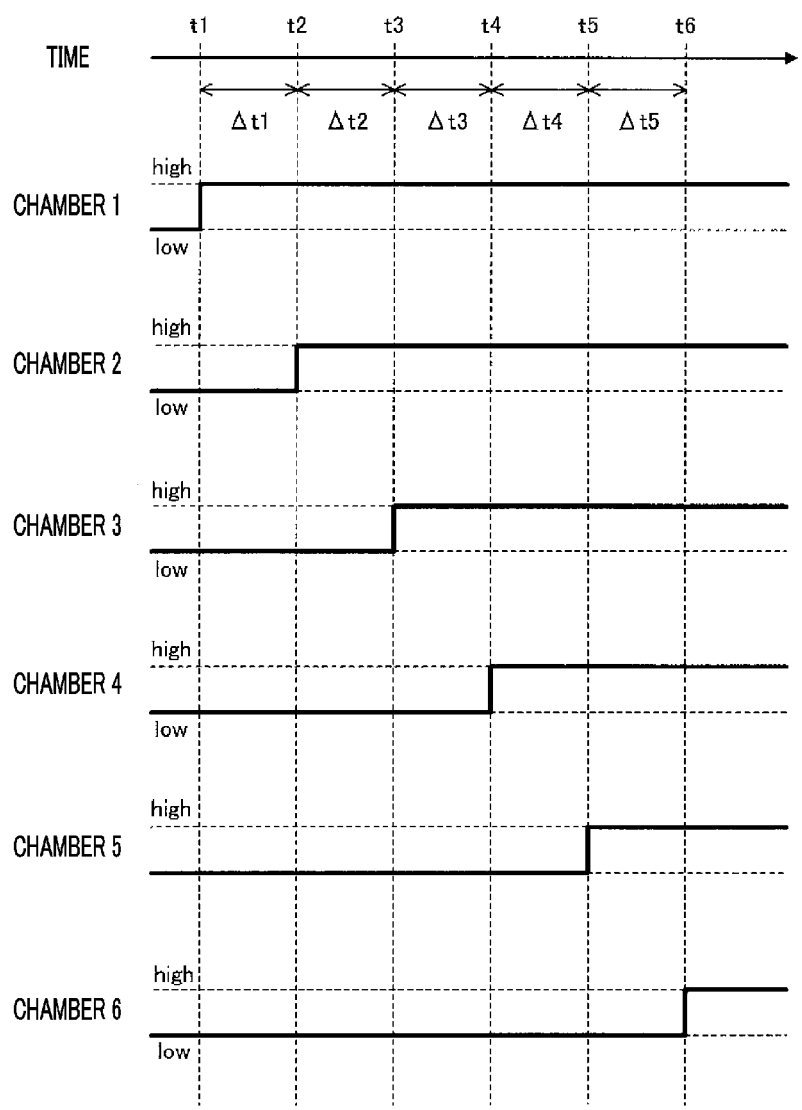

SUBSTRATE PROCESSING APPARATUS AND SUBSTRATE PROCESSING METHOD

CROSS-REFERENCE TO RELATED APPLICATION

This application claims the benefit of Japanese Patent Application No. 2020-026260 filed on Feb. 19, 2020, the entire disclosure of which is incorporated herein by reference.

TECHNICAL FIELD

The various aspects and embodiments described herein pertain generally to a substrate processing apparatus and a substrate processing method.

BACKGROUND

Patent Document 1 describes a vacuum processing apparatus having a plurality of processing units; and a chiller connected to coolant paths within sample tables respectively disposed within these processing units, and configured to supply and circulate a coolant adjusted to a required temperature. This vacuum processing apparatus is equipped with one circulation path and another circulation path. The one circulation path is a path through which the coolant discharged from the chiller diverges to be supplied into the coolant paths of the respective sample tables and through which the coolant flown from the respective coolant paths of the sample tables is returned back into the chiller after being merged. The another circulation path is a path through which the coolant discharged from the chiller is returned back into the chiller after bypassing branch points, the plurality of sample tables, and junctions.

Patent Document 1: Japanese Patent Laid-open Publication No. 2016-162794

SUMMARY

A system of processing a substrate includes substrate-processing chambers; target components of temperature control disposed in the respective substrate-processing chambers; a chiller to supply a first temperature-controlling medium with a first flow rate and a second temperature-controlling medium with a second flow rate into the target components; flow controllers connected to the respective target components, each flow controller being configured to independently control a ratio of the first flow rate to the second flow rate to be fed into the corresponding target component from the chiller.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 5 is an explanatory diagram showing temperature changing timings for individual chambers of the processing modules.

DETAILED DESCRIPTION

Figure 1:
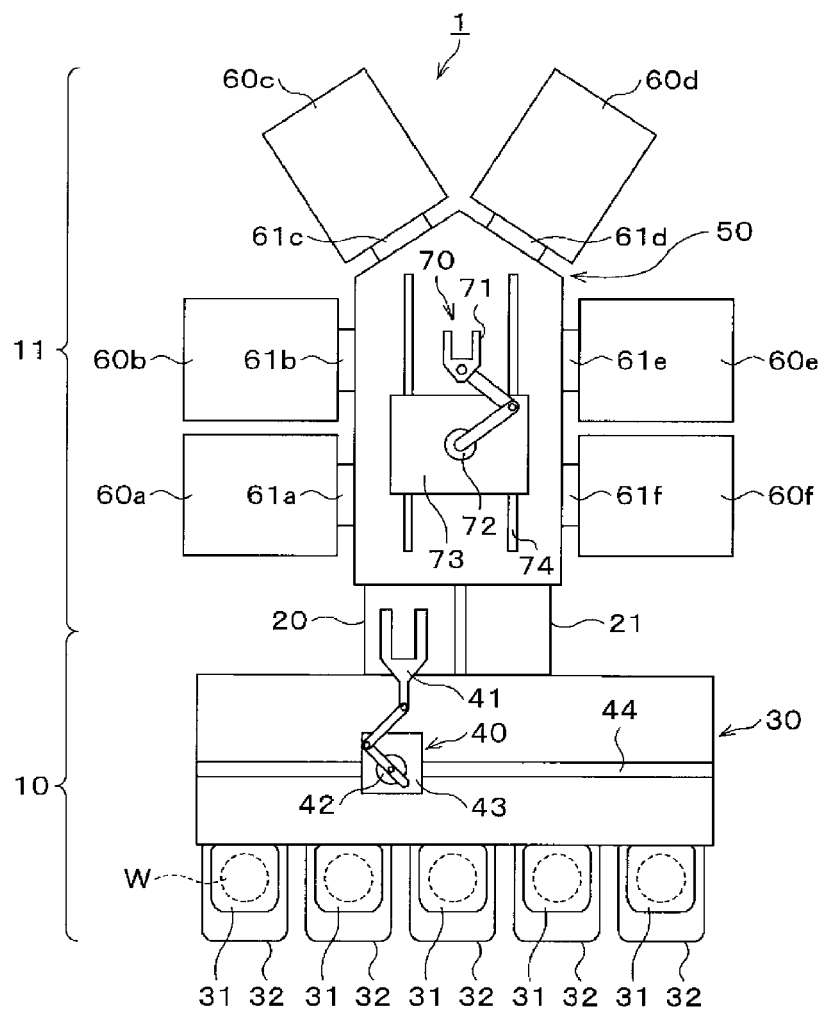
FIG. 1 is a plan view illustrating a schematic configuration of a wafer processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

In a manufacturing process for a semiconductor device, plasma is formed by exciting a processing gas, and a semiconductor wafer (hereinafter, simply referred to as "wafer") is processed by the plasma. Specifically, this plasma processing is performed in the state that the wafer is held on a substrate support which is provided within a chamber.

When the plasma processing is performed, a temperature of the wafer needs to be adjusted depending on a target process such as an etching processing, a film forming processing, a diffusion processing, or the like. For the purpose, a cooling medium is supplied into the substrate support from a chiller, for example, to thereby adjust a temperature of the substrate support.

Here, in the manufacturing process for the semiconductor device, a plurality of processing modules is provided within a single wafer processing apparatus, and the semiconductor device is manufactured efficiently by operating the plurality of processing modules in parallel. Conventionally, to control the temperatures of the substrate supports in the plurality of processing modules, a chiller is provided in each processing module. If, however, the multiple chillers are provided, there arise problems such as an increase of an installation cost and an increase of a footprint (occupation area) of the wafer processing apparatus. Further, since the multiple chillers are operated, there also arise problems such as an increase of energy consumption and complication of maintenance.

To solve the problems, in the vacuum processing apparatus described in Patent Document 1, a single chiller is provided for a plurality of processing units (processing modules). Further, it is described in Patent Document 1 that respective sample tables (stages) of the plurality of processing modules are set to have a same temperature when the processings are performed in the plurality of processing modules under same or substantially same conditions. Furthermore, it is also described in Patent Document 1 that the temperatures of the stages of the plurality of processing modules are controlled in a short time when the different processings are performed.

As the chiller described in Patent Document 1, a so-called single chiller is used, and a cooling medium of a single temperature is supplied from this chiller. Accordingly, the stages of the plurality of processing modules are controlled to have the single temperature, and cannot be controlled to have different temperatures. In view of this, there is still a room for improvement in the conventional wafer processing apparatus.

According to the present disclosure, there is provided a technique capable of controlling a plurality of temperature control targets respectively provided in a plurality of processing modules independently to have required temperatures by using a single chiller. Hereinafter, a wafer processing apparatus as a substrate processing apparatus and a wafer processing method as a substrate processing method according to exemplary embodiments will be explained with reference to the accompanying drawings. In the present specification and the drawings, parts having substantially same functions and configurations will be assigned same reference numerals, and redundant description will be omitted.

<Wafer Processing Apparatus>

First, a wafer processing apparatus 1 according to an exemplary embodiment will be described. FIG. 1 is a plan view illustrating a schematic configuration of the wafer processing apparatus 1 according to the present exemplary embodiment. The wafer processing apparatus 1 performs a processing such as, but not limited to, an etching processing, a film forming processing or a diffusion processing on a wafer W as a substrate.

As depicted in FIG. 1, the wafer processing apparatus 1 includes an atmospheric section 10 and a decompressed section 11 connected as one body with load lock modules 20 and 21 therebetween. The atmospheric section 10 is equipped with an atmospheric module configured to perform a required processing on the wafer W in an atmospheric atmosphere. The decompressed section 11 is equipped with a decompressed module configured to perform a required processing on the wafer W in a decompressed atmosphere.

The load lock modules 20 and 21 are configured to connect a loader module 30 of the atmospheric section 10 to be described later and a transfer module 50 of the decompressed section 11 to be described later with gate valves (not shown) therebetween. Each of the load lock modules 20 and 21 is configured to hold the wafer W temporarily. Further, each of the load lock modules 20 and 21 is configured such that an inside thereof is switched between the atmospheric atmosphere and the decompressed atmosphere (vacuum state).

The atmospheric section 10 includes the loader module 30 equipped with a wafer transfer device 40 to be described later; and load ports 32 on which FOUPs 31 each of which is capable of accommodating a plurality of wafers W therein are to be placed. Further, an orienter module (not shown) configured to adjust a direction of the wafer W in a horizontal direction, a storage module (not shown) configured to store a plurality of wafers W therein, or the like may be provided adjacent to the loader module 30.

The loader module 30 is implemented by a housing having a rectangular inside, and the inside of the housing is maintained in the atmospheric atmosphere. A multiple number of, for example, five load ports 32 are arranged at one long side of the housing of the loader module 30. The load lock modules 20 and 21 are arranged at the other long side of the housing of the loader module 30.

The wafer transfer device 40 configured to transfer the wafer W is provided within the loader module 30. The wafer transfer device 40 is equipped with a transfer arm 41 configured to be moved while holding the wafer W thereon; a rotary table 42 supporting the transfer arm 41 in a rotatable manner; and a rotary stage 43 on which the rotary table 42 is placed. Further, a guide rail 44 extending in a lengthwise direction of the loader module 30 is provided within the loader module 30. The rotary stage 43 is provided on the guide rail 44, and the wafer transfer device 40 is configured to be moved along the guide rail 44.

The decompressed section 11 has a transfer module 50 configured to transfer the wafer W; and processing modules 60 each configured to perform a required processing on the wafer W transferred from the transfer module 50. Insides of the transfer module 50 and the processing modules 60 are maintained in the decompressed atmosphere. A plurality of, e.g., six processing modules 60 are provided for the single transfer module 50. In the following description, the individual six processing modules 60 may be referred to as processing modules 60a to 60f. Further, the number and the layout of the processing modules 60 are not limited to the example of the present exemplary embodiment, and may be selected as required.

The transfer module 50 is implemented by a housing having a polygonal (pentagonal in the shown example) inside, and is connected to the load lock modules 20 and 21 as mentioned above. The transfer module 50 transfers the wafer W carried from the load lock module 20 into one of the processing modules 60. Then, after the required processing is performed on the wafer W, the transfer module 50 carries the wafer W into the atmospheric section 10 via the load lock module 21.

Each of the processing modules 60 is configured to perform a processing such as an etching processing, a film forming processing or a diffusion processing. Any of various modules configured to perform various target processings for the wafer may be selected as the processing modules 60. Further, the processing modules 60 are connected to the transfer module 50 via gate valves 61. In the following description, six gate valves 61 may be sometimes referred to as gate valves 61a to 61f to correspond to the processing modules 60a to 60f, respectively. A configuration of this processing module 60 will be elaborated later.

A wafer transfer device 70 configured to transfer the wafer W is provided within the transfer module 50. The wafer transfer device 70 is equipped with a transfer arm 71 configured to be moved while holding the wafer W thereon; a rotary table 72 supporting the transfer arm 71 in a rotatable manner; and a rotary stage 73 on which the rotary table 72 is placed. Further, a guide rail 74 extending in a lengthwise direction of the transfer module 50 is provided within the transfer module 50. The rotary stage 73 is provided on the guide rail 74, and the wafer transfer device 70 is configured to be moved along the guide rail 74.

In the transfer module 50, the wafer W held in the load lock module 20 is received by the transfer arm 71 and transferred into the processing module 60. Further, the wafer W after being subjected to the required processing is held by the transfer arm 71 and carried into the load lock module 21.

Now, a wafer processing performed by the wafer processing apparatus 1 having the above-described configuration will be explained.

First, the FOUP 31 accommodating the wafers W therein is placed on the load port 32.

Then, the wafer W is taken out from the FOUP 31 and carried into the load lock module 20 by the wafer transfer device 40. Once the wafer W is carried into the load lock module 20, the inside of the load lock module 20 is hermetically sealed to be decompressed. Then, the inside of the load lock module 20 and the inside of the transfer module 50 are allowed to communicate with each other.

Thereafter, the wafer W is held by the wafer transfer device 70 and transferred into the transfer module 50 from the load lock module 20.

Subsequently, the gate valve 61 is opened, and the wafer W is carried into the processing module 60 by the wafer transfer device 70. Then, the gate valve 61 is closed, and a required processing is performed on the wafer W in the processing module 60. The processing upon the wafer W will be elaborated later.

Next, the gate valve 61 is opened, and the wafer W is taken out from the processing module 60 by the wafer transfer device 70. Then, the gate valve 61 is closed.

Afterwards, the wafer W is carried into the load lock module 21 by the wafer transfer device 70. Once the wafer W is carried into the load lock module 21, the inside of the load lock module 21 is hermetically sealed and opened to the atmosphere. Then, the inside of the load lock module 21 and the inside of the loader module 30 are allowed to communicate with each other.

Then, the wafer W is held by the wafer transfer device 40, and carried from the load lock module 21 back into the FOUP 31 via the loader module 30 to be accommodated in the FOUP 31 again. Through these operations, the series of processes of the wafer processing in the wafer processing apparatus 1 are completed.

<Processing Module>

Figure 2:
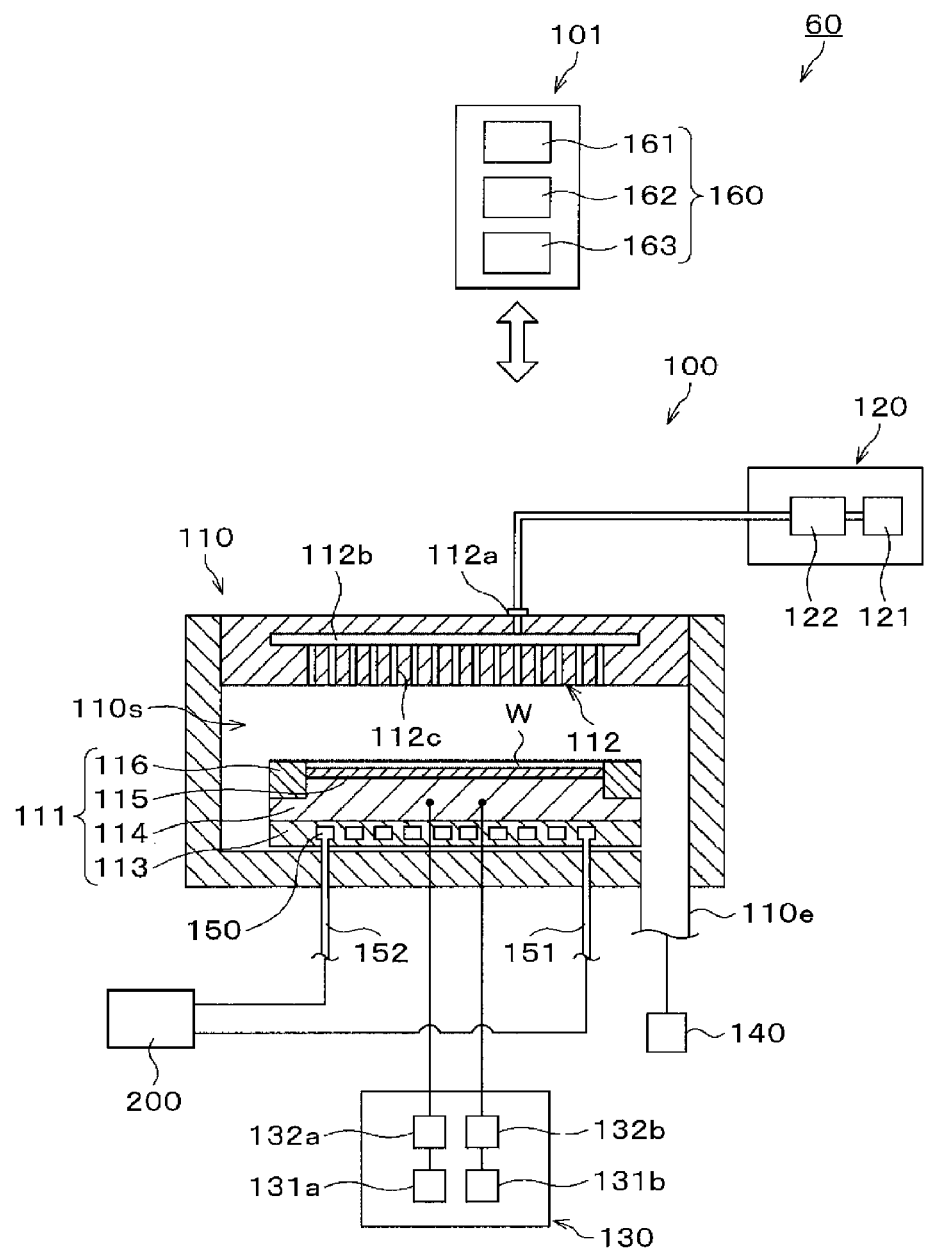
FIG. 2 is a longitudinal cross sectional view illustrating a schematic configuration of a processing module.

Now, the aforementioned processing module 60 will be explained. FIG. 2 is a longitudinal cross sectional view illustrating a schematic configuration of the processing module 60.

As depicted in FIG. 2, the processing module 60 includes a plasma processing apparatus 100 and a controller 101. The plasma processing apparatus 100 includes a plasma processing chamber (substrate-processing chamber) 110, a gas supply 120, a RF (Radio Frequency) power supply 130 and an exhaust system 140. Further, the plasma processing apparatus 100 also includes a substrate support (target component) 111 and an upper electrode shower head 112. The substrate support 111 is disposed in a lower region of a plasma processing space 110s within the plasma processing chamber 110. The upper electrode shower head 112 is disposed above the substrate support 111 and serves as a part of a ceiling of the plasma processing chamber 110.

The substrate support 111 is configured to support the wafer W in the plasma processing space 110s. In the exemplary embodiment, the substrate support 111 includes a base 113, a lower electrode 114, an electrostatic chuck 115 and an edge ring 116. The lower electrode 114 is disposed on the base 113. The electrostatic chuck 115 is disposed on the lower electrode 114 and configured to support the substrate W on a top surface thereof. The edge ring 116 is disposed on a top surface of a peripheral portion of the lower electrode 114 to surround the wafer W. Further, though not shown, in the present exemplary embodiment, the substrate support 111 may include a lifter pin configured to penetrate the substrate support 111 and be moved up and down while being in contact with a bottom surface of the wafer W.

A coolant path 150 is formed within the base 113. A cooling medium (hereinafter, referred to as "coolant") is supplied into the coolant path 150 from a chiller module 200 provided at an outside of the plasma processing chamber 110 via a coolant supply line 151. The coolant is an example of a temperature control medium. The temperature control medium includes, besides the coolant, a heat transfer medium. The coolant supplied into the coolant path 150 is returned back into the chiller module 200 via a coolant recovery line 152. In the following description, to distinguish this coolant from a first coolant and a second coolant to be described later, this coolant flowing in the coolant path 150, the coolant supply line 151 and the coolant recovery line 152 may be sometimes referred to as "circulation coolant." Further, six coolant supply lines 151 and six coolant recovery lines 152 may be referred to as coolant supply lines 151a to 151f and coolant recovery lines 152a to 152f to correspond to the processing modules 60a to 60f, respectively. By circulating the coolant in the coolant path 150, the substrate support 111 and the wafer W placed on the substrate support 111 can be controlled to reach a required temperature. That is, in the present exemplary embodiment, the substrate support 111 is a temperature control target according to the present disclosure. A configuration of the chiller module 200 will be elaborated later.

Furthermore, though not shown, in the exemplary embodiment, the substrate support 111 may be equipped with a temperature control module configured to adjust at least one of the electrostatic chuck 115 and the wafer W to have a required temperature. This temperature control module may include a heater, a path, or a combination thereof. A temperature control fluid such as a heat transfer gas flows in the path.

The upper electrode shower head 112 is configured to supply one or more processing gases from the gas supply 120 into the plasma processing space 110s. In the exemplary embodiment, the upper electrode shower head 12 has a gas inlet 112a, a gas diffusion space 112b and a multiple number of gas outlets 112c. The gas inlet 112a communicates with the gas supply 120 and the gas diffusion space 112b so that a fluid flows therebetween. The multiple number of gas outlets 112c communicate with the gas diffusion space 112b and the plasma processing space 110s so that the fluid flows therebetween. In the exemplary embodiment, the upper electrode shower head 112 is configured to supply the one or more processing gases from the gas inlet 112a into the plasma processing space 110s through the gas diffusion space 112b and the multiple number of gas outlets 112c.

The gas supply 120 may include one or more gas sources 121 and one or more flow rate controllers 122. In the exemplary embodiment, the gas supply 120 is configured to supply the one or more processing gases into the gas inlet 112a from the corresponding gas sources 121 via the corresponding flow rate controllers 122. Each flow rate controller 122 may include, by way of example, a mass flow controller or a pressure control type flow rate controller. Further, the gas supply 120 may include one or more flow rate modulating devices configured to pulse or modulate a flow rate of the one or more processing gases.

The RF power supply 130 is configured to supply a RF power, for example, one or more RF signals, to one or more electrodes, that is, either one or both of the lower electrode 114 and the upper electrode shower head 112. Accordingly, plasma is formed from the one or more processing gases supplied into the plasma processing space 110s. The RF power supply 130 is capable of serving as at least a part of a plasma formation unit configured to form the plasma from the one or more processing gases in the plasma processing chamber. In the exemplary embodiment, the RF power supply 130 includes two RF generators 131a and 131b and two matching circuits 132a and 132b. In the exemplary embodiment, the RF power supply 130 is configured to supply a first RF signal to the lower electrode 114 from the first RF generator 131a via the first matching circuit 132a. The first RF signal may have a frequency ranging from, e.g., 27 MHz to 100 MHz.

Further, in the exemplary embodiment, the RF power supply 130 is configured to supply a second RF signal from the second RF generator 131b to the lower electrode 114 via the second matching circuit 132b. The second RF signal may have a frequency ranging from, e.g., 400 kHz to 13.56 MHz. Here, a DC (Direct Current) pulse generator may be used instead of the second RF generator 131b.

Furthermore, though not shown, another exemplary embodiment may be considered in the present disclosure. By way of example, in this another exemplary embodiment, the RF power supply 130 may be configured to supply a first RF signal to the lower electrode 114 from a RF generator, supply a second RF signal to the lower electrode 114 from another RF generator, and supply a third RF signal to the lower electrode 114 from still another RF generator. In addition, in still another exemplary embodiment, a DC voltage may be applied to the upper electrode shower head 112.

Moreover, in the various exemplary embodiments, an amplitude of the one or more RF signals (that is, the first RF signal, the second RF signal, and so forth) may be pulsed or modulated. The amplitude modulation may include pulsing the amplitude of the RF signal between an on-state and an off-state or between two or more different on-states.

The exhaust system 140 may be connected to an exhaust port 110e provided at a bottom of the plasma processing chamber 110, for example. The exhaust system 140 may include a pressure valve and a vacuum pump. The vacuum pump may include a turbo molecular pump, a roughing vacuum pump or a combination thereof.

In the exemplary embodiment, the controller 101 executes a computer-executable command for implementing various processes to be described in the present disclosure in the plasma processing apparatus 100. The controller 101 may be configured to control the individual components of the plasma processing apparatus 100 to perform the various processes to be described herein. In the exemplary embodiment, a part or the whole of the controller 101 may belong to the plasma processing apparatus 100. The controller 101 may include, by way of example, a computer 160. The computer 160 may include, for example, a processor (CPU: Central Processing Unit) 161, a storage 162, and a communication interface 163. The processor 161 may be configured to perform various control operations based on a program stored in the storage 162. The storage 162 may include a RAM (Random Access Memory), a ROM (Read Only Memory), a HDD (Hard Disk Drive), a SSD (Solid State Drive), or combinations thereof. The communication interface 163 may communicate with the plasma processing apparatus 100 through a communication line such as a LAN (Local Area Network).

So far, the various exemplary embodiments have been described. However, the present disclosure is not limited to the above-described exemplary embodiments, and various additions, omissions, replacements and modifications may be made. Further, by combining the components in the various exemplary embodiments, other exemplary embodiments may be conceived.

Now, the wafer processing performed by using the processing module 60 having the above-described configuration will be discussed. The processing module 60 performs a processing such as, but not limited to, an etching processing, a film forming processing, a diffusion processing, or the like on the wafer W.

First, the wafer W is carried into the plasma processing chamber 110, and the lifter pin is moved up and down to place the wafer W on the electrostatic chuck 115. Then, by applying the DC voltage to the electrode of the electrostatic chuck 115, the wafer W is electrostatically attracted to and held by the electrostatic chuck 115 by a Coulomb force. Further, after the wafer W is carried in, the inside of the plasma processing chamber 110 is decompressed to a preset vacuum level by the exhaust system 140.

Subsequently, the processing gas is supplied into the plasma processing space 110s from the gas supply 120 via the upper electrode shower head 112. Further, the high frequency (HF) power for plasma formation is supplied to the lower electrode 114 by the RF power supply 130, so that the processing gas is excited into plasma. At this time, the high frequency (LF) power for ion attraction may be supplied by the RF power supply 130. A plasma processing is performed on the wafer W by the formed plasma.

During the plasma processing, the temperature of the wafer W attracted to and held by the electrostatic chuck 115 is controlled by the chiller module 200. At this time, to transfer heat to the wafer W efficiently, the heat transfer gas such as a He gas or an Ar gas is supplied toward the rear surface of the wafer W attracted to the top surface of the electrostatic chuck 115.

To end the plasma processing, the supply of the high frequency (HF) power from the RF power supply 130 and the supply of the processing gas from the gas supply 120 are first stopped. Further, in case that the high frequency (LF) power is supplied in the plasma processing, the supply of this high frequency (LF) power is also stopped. Then, the supply of the heat transfer gas to the rear surface of the wafer W is stopped, and the attracting and holding of the wafer W by the electrostatic chuck 115 is stopped.

Thereafter, the wafer W is separated from the electrostatic chuck 115 by being raised by the lifter pin. When this separation is performed, charge neutralization of the wafer W may be performed. Then, the wafer W is carried out from the plasma processing chamber 110, and the series of processes of the plasma processing upon the wafer W are completed.

<Chiller Module>

Figure 3:
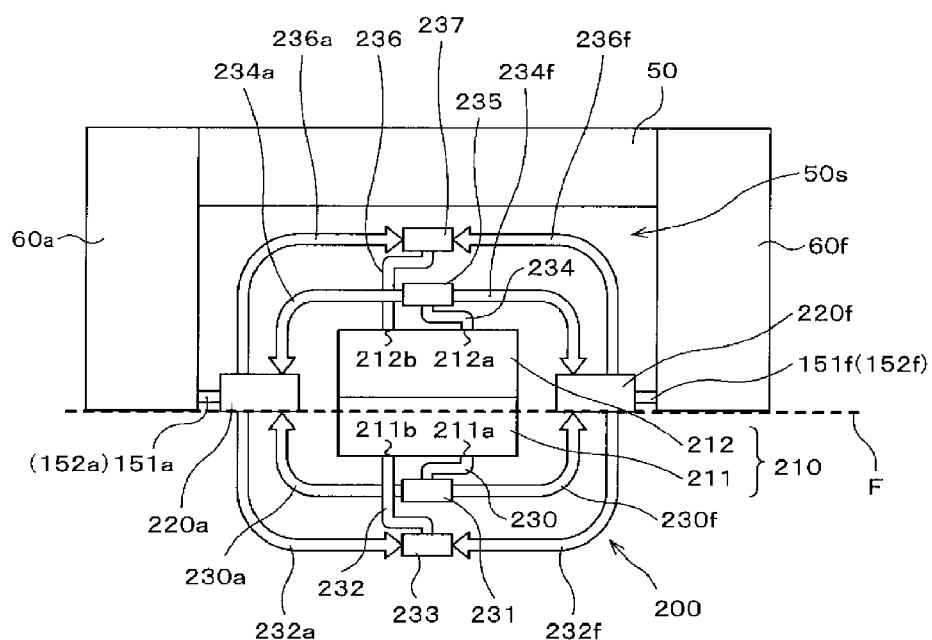
FIG. 3 is a side view illustrating a schematic configuration of a chiller module.
Figure 4:
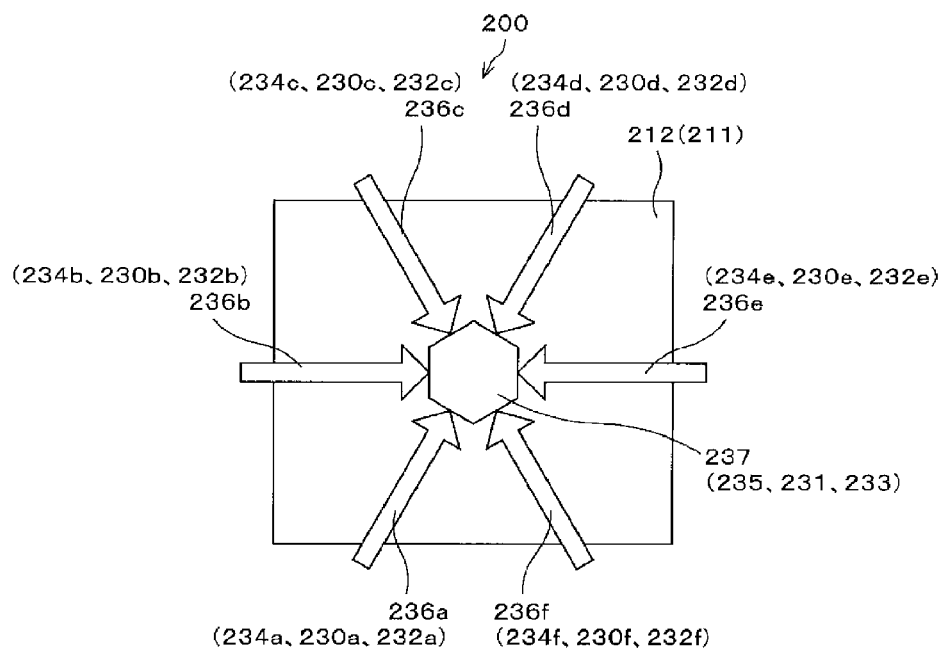
FIG. 4 is a plan view illustrating the schematic configuration of the chiller module.

Now, the aforementioned chiller module 200 will be described. FIG. 3 is a side view illustrating a schematic configuration of the chiller module 200. FIG. 4 is a plan view illustrating the schematic configuration of the chiller module 200. Individual components of the chiller module 200 in FIG. 3 and FIG. 4 are schematically illustrated to ease understanding of the description, and layouts and sizes of the components may not necessarily coincide with actual layouts and sizes.

As depicted in FIG. 3 and FIG. 4, the chiller module 200 includes a dual chiller 210 and a multiple number of flow controllers 220. The chiller module 200 is disposed in a space 50s which exists under the transfer module 50.

The dual chiller 210 is only one in the chiller module 200 and shared by the six processing modules 60a to 60f. That is, the dual chiller 210 is capable of supplying coolants to the six processing modules 60a to 60f. The dual chiller 210 is configured to supply the coolants as temperature control media having two different temperatures, and is equipped with a first coolant control unit 211 as a first temperature control medium control unit (first thermoregulator) and a second coolant control unit 212 as a second temperature control medium control unit (second thermoregulator).

The first coolant control unit 211 is configured to supply a first coolant having a first temperature (low temperature). To supply the first coolant of the low temperature, the first coolant control unit 211 has, for example, a compressor. A first supply port (first inlet port) 211*a* through which the first coolant is supplied and a first recovery port (first outlet port) 211*b* through which a circulation coolant is introduced are formed at a bottom surface of the first coolant control unit 211. The first supply port 211*a* and the first recovery port 211*b* are formed at a substantially center of the first coolant control unit 211.

The second coolant control unit 212 is configured to supply a second coolant having a second temperature (high temperature) higher than the first temperature. To supply the second coolant of the high temperature, the second coolant control unit 212 has, for example, a heater. A second supply port (second inlet port) 212*a* through which the second coolant is supplied and a second recovery port (second outlet port) 212*b* through which a circulation coolant is introduced are formed at a top surface of the second coolant control unit 212. The second supply port 212*a* and the second recovery port 212*b* are formed at a substantially center of the second coolant control unit 212.

The first coolant control unit 211 is disposed under the second coolant control unit 212. Further, the position of the first coolant control unit 211 and the second coolant control unit 212 in the vertical direction may be reversed to the way they are arranged in the present exemplary embodiment. However, the first coolant control unit 211 needs various devices including the compressor having a large weight as it changes a pressure and a temperature by compressing the coolant, for example, and supplies the first coolant having the low temperature as stated above. In such a case, it is desirable to place the first coolant control unit 211 at the lower side as in the present exemplary embodiment. With this layout, the dual chiller 210 can be provided stably.

The first coolant control unit 211 is disposed under a ground floor F on which the plasma processing apparatus 100 (the plasma processing chamber 110 of the processing module 60) is provided. The second coolant control unit 212 is disposed on the ground floor F. Here, the space 50*s* under the transfer module 50 is a limited space having a height of, e.g., 1 m. By locating the first coolant control unit 211 under the ground floor as in the present exemplary embodiment, the chiller module 200 can be accommodated in the space 50*s*. Furthermore, since the space 50*s* can be utilized effectively by putting the first coolant control unit 211 under the ground floor as stated above, a footprint of the wafer processing apparatus 1 can be reduced as compared to the conventional case where the chiller is provided at the outside of the wafer processing apparatus 1.

The number of the flow controllers 220 is six, and these six flow controllers 220 respectively correspond to the processing modules 60*a* to 60*f*. In the following description, the six flow controllers 220 may be sometimes referred to as flow controllers 220*a* to 220*f* for the processing modules 60*a* to 60*f*, respectively. Coolant supply lines 151*a* to 151*f* and coolant recovery lines 152*a* to 152*f* are connected to the flow controllers 220*a* to 220*f*, respectively.

Each flow controller 220 is a so-called valve box and includes a multiple number of valves (not shown) such as flow rate control valves. The flow controller 220 is configured to adjust a flow rate ratio between the first coolant supplied from the first coolant control unit 211 and the second coolant supplied from the second coolant control unit 212. In the flow controller 220, a circulation coolant is produced by mixing the first coolant and the second coolant at a required flow rate ratio, and this produced circulation coolant is supplied into the coolant supply line 151. Further, by producing the circulation coolant having a required flow rate ratio in each of the flow controllers 220*a* to 220*f*, circulation coolants of different temperatures can be produced, and, accordingly, temperatures of the substrate supports 111 of the processing modules 60*a* to 60*f* can be controlled independently.

Furthermore, the flow controller 220 is configured to be capable of adjusting a flow rate ratio at which the circulation coolant introduced from the coolant recovery line 152 after being used in controlling the temperature of the substrate support 111 is distributed into the first coolant control unit 211 and the second coolant control unit 212.

The first supply port 211*a* of the first coolant control unit 211 and the flow controller 220 are connected by a first supply channel 230. By way of non-limiting example, a pipeline or a hose is used as the first supply channel 230. The first supply channel 230 connected to the first supply port 211*a* is branched into first supply channels 230*a* to 230*f* via a first supply manifold 231 having a hexagonal shape when viewed from the top (in planar view). The first supply channels 230*a* to 230*f* are connected to the flow controllers 220*a* to 220*f*, respectively. Further, lengths of the first supply channels 230*a* to 230*f* are substantially same.

The first recovery port 211*b* of the first coolant control unit 211 and the flow controller 220 are connected by a first recovery channel 232. By way of non-limiting example, a pipeline or a hose may be used as the first recovery channel 232. The first recovery channel 232 connected to the first recovery port 211*b* is branched into first recovery channels 232*a* to 232*f* via a first recovery manifold 233 having a hexagonal shape when viewed from the top. The first recovery channels 232*a* to 232*f* are connected to the flow controllers 220*a* to 220*f*, respectively. Further, lengths of the first recovery channels 232*a* to 232*f* are substantially same.

The first supply channel 230 (230*a* to 230*f*), the first supply manifold 231, the first recovery channel 232 (232*a* to 232*f*) and the first recovery manifold 233 are disposed under the ground floor F. The first supply manifold 231 and the first recovery manifold 233 are arranged at different heights and overlapped with each other when viewed from the top. In the present exemplary embodiment, since the first supply manifold 231 is located above the first recovery manifold 233, the first supply port 211*a* and the first recovery port 211*b* are formed at the substantially center of the first coolant control unit 211. Further, the first supply channels 230*a* to 230*f* and the first recovery channels 232*a* to 232*f* are also disposed at different heights.

The second supply port 212*a* of the second coolant control unit 212 and the flow controller 220 are connected by a second supply channel 234. For example, a pipeline or a hose is used as the second supply channel 234. The second supply channel 234 connected to the second supply port 212*a* is branched into second supply channels 234*a* to 234*f* via a second supply manifold 235 having a hexagonal shape when viewed from the top. The second supply channels 234*a* to 234*f* are connected to the flow controllers 220*a* to 220*f*, respectively. Further, lengths of the second supply channels 234*a* to 234*f* are substantially same.

The second recovery port 212*b* of the second coolant control unit 212 and the flow controller 220 are connected by a second recovery channel 236. By way of non-limiting example, a pipeline or a hose may be used as the second recovery channel 236. The second recovery channel 236 connected to the second recovery port 212*b* is branched into second recovery channels 236*a* to 236*f* via a second recovery manifold 237 having a hexagonal shape when viewed from the top. The second recovery channels 236*a* to 236*f* are connected to the flow controllers 220*a* to 220*f*, respectively. Further, lengths of the second recovery channels 236*a* to 236*f* are substantially same.

The second supply channel 234 (234*a* to 234*f*), the second supply manifold 235, the second recovery channel 236 (236*a* to 236*f*) and the second recovery manifold 237 are disposed above the ground floor F. The second supply manifold 235 and the second recovery manifold 237 are arranged at different heights and overlapped with each other when viewed from the top. In the present exemplary embodiment, since the second supply manifold 235 is located under the second recovery manifold 237, the second supply port 212*a* and the second recovery port 212*b* are formed at the substantially center of the second coolant control unit 212. Further, the second supply channels 234*a* to 234*f* and the second recovery channels 236*a* to 236*f* are also disposed at different heights.

Furthermore, lengths of the first supply channel 230 (including 230*a* to 230*f*), the first recovery channel 232 (including 232*a* to 232*f*), the second supply channel 234 (including 234*a* to 234*f*) and the second recovery channel 236 (including 236*a* to 236*f*) are substantially same.

A top surface of the chiller module 200 having the above-described configuration, that is, a top surface of a housing (not shown) accommodating therein the dual chiller 210, the flow controllers 220*a* to 220*f*, the second supply channel 234, the second supply manifold 235, the second recovery channel 236, the second recovery manifold 237, and so forth has a flat shape. Thus, the chiller module 200 can be placed under the transfer module 50 as stated above.

Further, the chiller module 200 is equipped with a pump (not shown) configured to allow the first coolant, the second coolant and the circulation coolant to flow. Six pumps may be provided for the processing modules 60*a* to 60*f*, respectively, or a single pump may be shared by the processing modules 60*a* to 60*f*.

Moreover, in the present exemplary embodiment, the controller 101 is configured to control the individual components of the chiller module 200.

In this configuration, the first coolant of the low temperature supplied from the first coolant control unit 211 of the dual chiller 210 is introduced into the flow controllers 220*a* to 220*f* via the first supply channel 230 after being distributed by the first supply manifold 231. Further, the second coolant of the high temperature supplied from the second coolant control unit 212 is introduced into the flow controllers 220*a* to 220*f* via the second supply channel 234 after being distributed by the second supply manifold 235. Then, circulation coolants having required temperatures are produced by adjusting the flow rate ratio between the first coolant and the second coolant in the flow controllers 220*a* to 220*f*.

The circulation coolants produced in the flow controllers 220*a* to 220*f* are supplied into the coolant paths 150 via the coolant supply lines 151*a* to 151*f*, respectively, so that the substrate supports 111 of the processing modules 60*a* to 60*f* are regulated to required temperatures. Then, the circulation coolants after being used for the temperature control are flown back into the flow controllers 220*a* to 220*f* via the coolant recovery lines 152*a* to 152*f*, respectively.

In each of the flow controllers 220*a* to 220*f*, the circulation coolant is distributed into the first coolant control unit 211 and the second coolant control unit 212 at a required flow rate ratio. The circulation coolant for the first coolant control unit 211 is flown up to the first recovery manifold 233 via the first recovery channel 232 and then flown into the first coolant control unit 211. The circulation coolant for the second coolant control unit 212 is flown up to the second recovery manifold 237 via the second recovery channel 236 and then flown into the second coolant control unit 212. In this way, by circulating the coolants as described above, the chiller module 200 controls the temperatures of the substrate supports 111 of the processing modules 60*a* to 60*f* independently.

According to the present exemplary embodiment, since the chiller module 200 has the single dual chiller 210 and the six flow controllers 220*a* to 220*f*, the circulation coolants having the required temperatures can be produced by adjusting the flow rate ratio between the first coolant and the second coolant in the flow controllers 220*a* and 220*f*. As a result, the temperatures of the substrate supports 111 of the six processing modules 60*a* to 60*f* can be controlled individually. By way of example, in case that the processing modules 60*a* to 60*f* perform a processing under different processing conditions, the temperatures of the substrate supports 111 can be controlled to have different temperatures. If, on the other hand, the processing modules 60*a* to 60*f* perform the processing under the same processing condition, the temperatures of the substrate supports 111 can be controlled to have the same temperature.

Moreover, the top surface of the chiller module 200 has the flat shape (flat top surface). Further, the first coolant control unit 211, the first supply channel 230, the first supply manifold 231, the first recovery channel 232, and the first recovery manifold 233 are disposed under the ground floor F. With this configuration, the chiller module 200 can be put in the space 50*s* under the transfer module 50, and the space 50*s* can be occupied effectively. As a result, the footprint of the wafer processing apparatus 1 can be reduced.

In addition, by providing the chiller module 200 in the space 50*s*, the lengths of the coolant supply lines 151*a* to 151*f* and the coolant recovery lines 152*a* to 152*f* led to the processing modules 60*a* to 60*f* around the chiller module 200 can be minimized.

Further, since the manifolds 231, 233, 235 and 237 have the hexagonal shapes, the lengths of the channels 230*a* to 230*f*, 232*a* to 232*f*, 234*a* to 234*f*, and 236*a* to 236*f* connecting these manifolds 231, 233, 235 and 237 and the flow controllers 220*a* to 220*f* can be set to have a same minimum value.

Moreover, since the first supply manifold 231 and the first recovery manifold 233 are provided at the different heights, the first supply port 211*a* and the first recovery port 211*b* can be formed at the substantially center of the first coolant control unit 211. Likewise, the second supply port 212*a* and the second recovery port 212*b* can be formed at the substantially center of the second coolant control unit 212. With this configuration, the lengths of the channels 230*a* to 230*f*, 232*a* to 232*f*, 234*a* to 234*f*, and 236*a* to 236*f* can be set to have the same minimum value.

In addition, the lengths of the channels 230*a* to 230*f*, 232*a* to 232*f*, 234*a* to 234*f*, and 236*a* to 236*f* can be set to be same.

As described above, since the channels 230*a* to 230*f*, 232*a* to 232*f*, 234*a* to 234*f*, and 236*a* to 236*f* have the same minimum length, the coolant path between the chiller module 200 and each of the processing modules 60*a* to 60*f* can be set to have a minimum length. Accordingly, the supply amount of the coolant (the first coolant, the second coolant and the circulation coolant) can be reduced as compared to the conventional cases. Further, since the supply amount of the coolant can be reduced by minimizing the length of the coolant path, the running cost can be cut. Moreover, supplies (power, cooling water, and so forth) for the pump for circulating the coolant (the first coolant, the second coolant and the circulation coolant) between the chiller module 200 and the processing modules 60a to 60f can also be reduced. Furthermore, since a time during which the coolant is circulated can be shortened, thermal responsiveness can be improved, and a time taken to increase or decrease the temperature of the substrate support 111 can also be reduced. Additionally, since an operation of the apparatus can be begun in a short time, a time required for maintenance thereof can also be reduced.

Furthermore, since the single dual chiller 210 is shared by the six processing modules 60a to 60f, the installation cost can be reduced as compared to the conventional case where multiple chillers are provided. Further, energy for operating the single dual chiller 210 can also be reduced as compared to the conventional case where the multiple chillers are provided. In addition, since the only one dual chiller 210 is provided, the number of processes for the maintenance can also be reduced.

Here, the chiller exerts a maximum output (cooling capacity) when it changes a temperature of a temperature control target. Thus, when the multiple chillers are respectively connected to the chambers of the individual processing modules as in the prior art, each chiller needs to have a cooling capacity as a sum of a cooling capacity required in a typical operation (when the temperature of the temperature control target is not changed) and a cooling capacity (extra capacity) required when it changes the temperature.

In contrast, according to the present exemplary embodiment, since the single dual chiller 210 is shared by the chambers of the multiple processing modules 60a to 60f, the aforementioned extra capacity can be shared by setting timings for the changing of the temperatures of the temperature control targets (in the present exemplary embodiment, the substrate supports 111) of the respective chambers not to be overlapped. By way of example, when the single dual chiller 210 is shared by the six chambers, the controller 101 changes a temperature of a first temperature control target from a low temperature to a high temperature at a time t1, and changes a temperature of a second temperature control target from a low temperature to a high temperature at a time t2 upon a lapse of Δt1, as depicted in FIG. 5. Then, in the same way, the controller 101 changes temperatures of the rest temperature control targets at a preset time interval. In this way, the extra capacity can be shared. As a consequence, since a relatively small-sized chiller can be used even when the single dual chiller 210 is shared by the six chambers, energy can be saved and the footprint can be reduced.

Other Exemplary Embodiments

The above exemplary embodiment has been described for the case where the temperature control target is the substrate support 111. However, the temperature control target is not limited thereto. By way of example, the chiller module 200 according to the present exemplary embodiment can also be used to control a temperature of a sidewall of the plasma processing chamber 110 or a temperature of the upper electrode shower head 112.

In the wafer processing apparatus 1 of the above-described exemplary embodiment, the substrate support 111 may be equipped with a temperature sensor (thermosensor; not shown) configured to measure the temperature of the substrate support 111. A measurement result by the temperature sensor is outputted to the controller 101. The controller 101 controls, based on the measurement result of the temperature sensor, the flow controller 220 to adjust the temperature of the circulation coolant by adjusting the flow rate ratio between the first coolant and the second coolant such that the temperature of the substrate support 111 reaches a target temperature. If the temperature sensor is used, a real time control can be carried out.

In the wafer processing apparatus 1 according to the above-described exemplary embodiment, the first coolant control unit 211, the first supply channel 230, the first supply manifold 231, the first recovery channel 232 and the first recovery manifold 233 are placed under the ground floor F. However, if a sufficient space is provided in the space 50s, these components may be disposed above the ground floor F.

The chiller module 200 according to the above-described exemplary embodiment has the single dual chiller 210. However, the chiller module 200 may have an additional same dual chiller 210 for backup.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiment, by using the single chiller, temperatures of the temperature control targets respectively provided in the plurality of processing modules cam ne controlled independently.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A system of processing a substrate, comprising:
   substrate-processing chambers;
   target components of temperature control disposed in the respective substrate-processing chambers;
   a chiller to supply a first temperature-controlling medium with a first flow rate and a second temperature-controlling medium with a second flow rate into the target components;
   flow controllers connected to the respective target components, each flow controller being configured to independently control a ratio of the first flow rate to the second flow rate to be fed into the corresponding target component from the chiller,
   wherein the chiller comprises a first thermoregulator to control the first temperature-controlling medium to a first temperature and a second thermoregulator to control the second temperature-controlling medium to a second temperature, the second temperature being higher than the first temperature, the first thermoregulator has a first inlet port to supply the controlled first temperature-controlling medium to the respective target components and the first outlet port to recover the first temperature-controlling medium from the target components, and the second thermoregulator has a second inlet port to supply the controlled second temperature-controlling medium to the respective target components and the second outlet port to recover the second temperature-controlling medium from the target components, wherein the system further comprises:
first supply channels disposed between the first inlet port and the flow controllers, respectively;
first recovery channels disposed between the first outlet port and the flow controllers, respectively;
second supply channels disposed between the second inlet port and the flow controllers, respectively; and
second recovery channels disposed between the second outlet port and the flow controllers, respectively, wherein the first inlet port and the first outlet port are disposed in a center of the first thermoregulator;
the first supply channels have a first height, and the first recovery channels have a second height differing from the first height;
the second inlet port and the second outlet port are disposed in a center of the second thermoregulator; and
the second supply channels have a third height, and the second recovery channels have a fourth height differing from the third height.

2. The system according to claim 1, wherein
the first supply channels have an identical length;
the first recovery channels have an identical length;
the second supply channels have an identical length; and
the second recovery channels have an identical length.

3. A system of processing a substrate, comprising:
substrate-processing chambers;
target components of temperature control disposed in the respective substrate-processing chambers;
a chiller to supply a first temperature-controlling medium with a first flow rate and a second temperature-controlling medium with a second flow rate into the target components;
flow controllers connected to the respective target components, each flow controller being configured to independently control a ratio of the first flow rate to the second flow rate to be fed into the corresponding target component from the chiller,
wherein the chiller comprises a first thermoregulator to control the first temperature-controlling medium to a first temperature and a second thermoregulator to control the second temperature-controlling medium to a second temperature, the second temperature being higher than the first temperature;
the first thermoregulator has a first inlet port to supply the controlled first temperature-controlling medium to the respective target components and the first outlet port to recover the first temperature-controlling medium from the target components;
the second thermoregulator has a second inlet port to supply the controlled second temperature-controlling medium to the respective target components and the second outlet port to recover the second temperature-controlling medium from the target components,
wherein the system further comprises:
first supply channels disposed between the first inlet port and the flow controllers, respectively;
first recovery channels disposed between the first outlet port and the flow controllers, respectively;
second supply channels disposed between the second inlet port and the flow controllers, respectively; and
second recovery channels disposed between the second outlet port and the flow controllers, respectively,
wherein the first thermoregulator includes a first supply manifold and a first recovery manifold that have a polygonal shape in planar view;
the first supply channels, respectively, extend from the first inlet port to the flow controllers, through the first supply manifold;
the first recovery channels, respectively, extend from the first recovery port to the flow controllers, through the first recovery manifold;
the second thermoregulator includes a second supply manifold and a second recovery manifold that have a polygonal shape in planar view;
the second supply channels, respectively, extend from the second inlet port to the flow controllers, through the second supply manifold; and
the second recovery channels, respectively, extend from the second recovery port to the flow controllers, through the second recovery manifold.

4. The system according to claim 3, wherein
the first supply channels being divergent from the first supply manifold and extending to the respective flow controllers have an identical length;
the first recovery channels being divergent from the first recovery manifold and extending to the respective flow controllers have an identical length;
the second supply channels being divergent from the second supply manifold and extending to the respective flow controllers have an identical length; and
the second recovery channels being divergent from the second recovery manifold and extending to the respective flow controllers have an identical length.

5. The system according to claim 4, wherein
the first thermoregulator is disposed below the second thermoregulator.

6. The system according to claim 5, further comprising:
a transfer module to transfer the substrate, wherein
the substrate-processing chambers are connected to the transfer module; and
the chiller is disposed below the transfer module.

7. The system according to claim 5, further comprising:
a chiller module accommodating the chiller and flow controllers, the chiller module having a flat top face.

8. The system according to claim 4, wherein
the substrate-processing chamber are disposed on a floor;
the first thermoregulator is disposed below the floor; and
the second thermoregulator is disposed above the floor.

9. The system according to claim 8, wherein
the target component is one selected from a group consisting of a substrate support for holding the substrate in the substrate-processing chamber, an electrode provided at an upper portion of the substrate-processing chamber, and a sidewall of the substrate-processing chamber.

10. The system according to claim 8, wherein
the target component is provided with a thermosensor to measure a temperature of the target component; and
a controller controls the flow controller in response to the temperature observed by the thermosensor.

11. The system according to claim 3, wherein
the first supply channels have an identical length;
the first recovery channels have an identical length;

the second supply channels have an identical length; and
the second recovery channels have an identical length.

* * * * *